United States Patent
Straemke

(10) Patent No.: US 7,419,566 B2
(45) Date of Patent: Sep. 2, 2008

(54) PLASMA REACTOR

(76) Inventor: Siegfried Straemke, Arnold-Sommerfeld-Ring 3, 52499 Baesweiler (DE)

( * ) Notice: Subject to any disclaimer, the term of this patent is extended or adjusted under 35 U.S.C. 154(b) by 444 days.

(21) Appl. No.: 10/610,575

(22) Filed: Jul. 2, 2003

(65) Prior Publication Data
US 2005/0016460 A1   Jan. 27, 2005

(30) Foreign Application Priority Data
Jul. 4, 2002   (DE)   ............. 202 10 328 U

(51) Int. Cl.
C23C 16/00 (2006.01)
H01L 21/306 (2006.01)
(52) U.S. Cl. ............. 156/345.37; 156/345.48; 118/723 R; 118/723 I; 118/724
(58) Field of Classification Search ....... 118/723 I, 118/723 IR, 723 AN, 723 R, 724, 725; 156/345.48, 156/345.49, 345.37; 315/111.51
See application file for complete search history.

(56) References Cited

U.S. PATENT DOCUMENTS

| | | | |
|---|---|---|---|
| 5,846,375 A | 12/1998 | Gilchrist et al. | |
| 6,074,512 A | * 6/2000 | Collins et al. | 156/345.29 |
| 6,475,334 B1 | * 11/2002 | Harano | 156/345.48 |
| 2002/0023589 A1 | 2/2002 | Kondo et al. | |

FOREIGN PATENT DOCUMENTS

| EP | 0 468 742 A2 | * | 1/1992 |
|---|---|---|---|
| JP | 06-124795 | * | 1/1994 |
| JP | 10-149898 | * | 6/1998 |

* cited by examiner

Primary Examiner—Luz L. Alejandro
(74) Attorney, Agent, or Firm—Diller, Ramik & Wight

(57) ABSTRACT

The plasma reactor comprises at least one cooling device (15, 16) consisting of two cooling elements (15a, 15b; 16a, 16b) adapted to be separately switched on and off. The heat produced during the plasma treatment is dissipated by the cooling device. In doing so, cooling elements are connected or disconnected in order to enlarge or reduce the effective cooling surface. The cooling elements (15a, 15b; 16a, 16b) are arranged in an interlaced manner so that local cooling peaks are avoided and, on the whole, an approximately uniform cooling sets in.

6 Claims, 1 Drawing Sheet

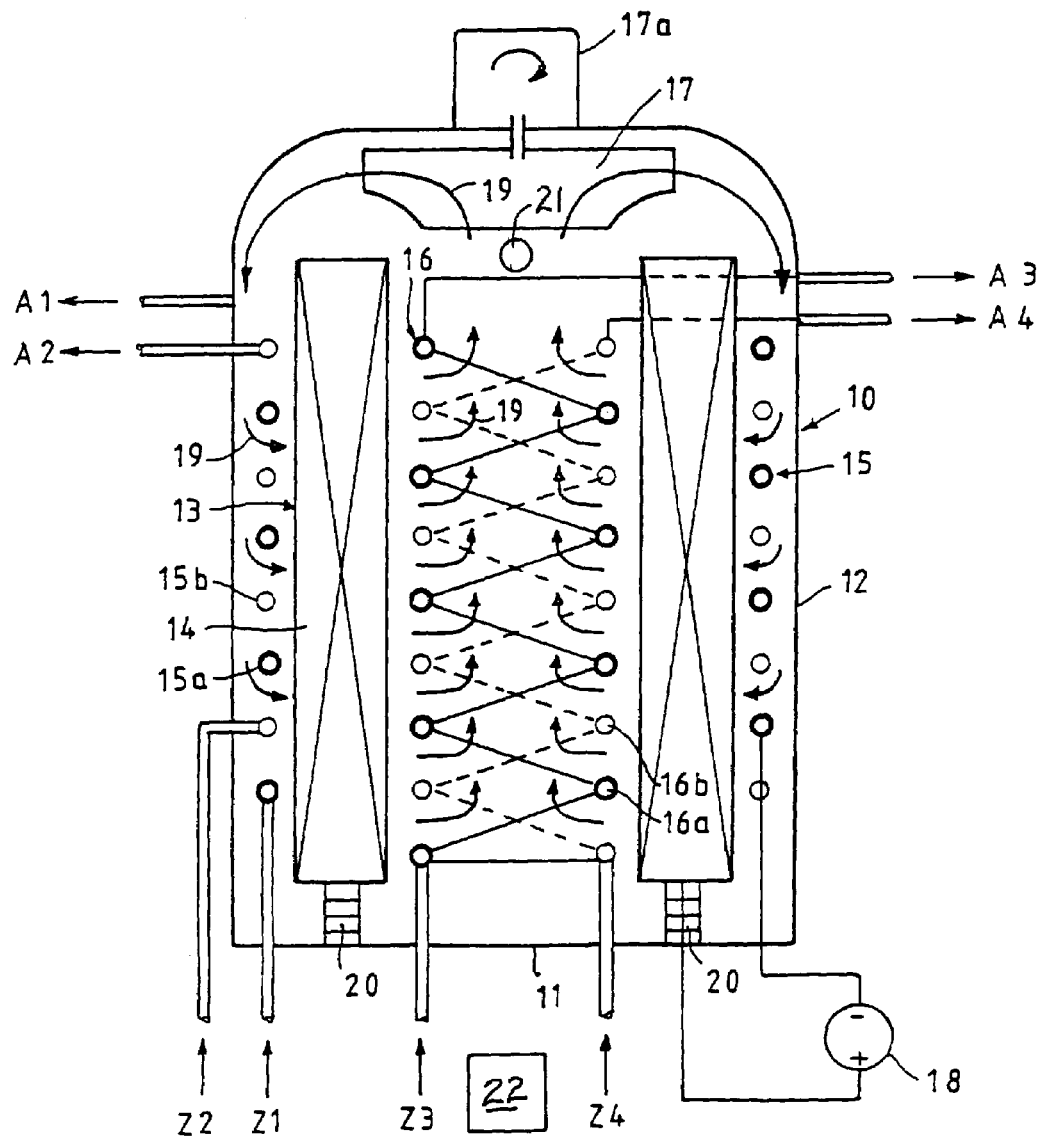

PLASMA REACTOR

BACKGROUND OF THE INVENTION

Field of the Invention

The invention relates to a plasma reactor comprising a vacuum-tight container adapted to be connected to a vacuum pump and containing a process room for receiving works, a voltage source for applying a voltage to the work, and a cooling device arranged in the container, for dissipating radiation heat from the work.

In plasma processes where a work is subjected to a plasma treatment such as plasma nitriding, plasma carburizing or plasma coating, energy is introduced into the container via the electric discharge occurring at the surface of the work. In the stationary case, energy is dissipated via wall, cover and bottom of the container via radiation. If this energy dissipation is insufficient, it is possible to install a cooling device in the container. Typically, such a cooling device consists of cooling fingers in the form of water-cooled cylinders. Such cooling fingers form punctual sumps for the heat radiation, unequal temperature distributions possibly occurring in the process room of the container. As a rule, it is possible for a specific batch only to arrange the cooling fingers such that the desired thermal economy is generated. Another disadvantage of cooling fingers consists in that condensation water is produced on the cold surface. Further, there is the problem that the ends of the batch are basically too cold since heat is dissipated additionally via the cover and the bottom.

In U.S. Pat. No. 5,846,375, a temperature control system for the selective control of the temperature in different zones of a work platform is described, the work platform being disposed in a vacuum container for treating semiconductor wafers. The work platform includes several coaxially extending annular channels connected to separate cooling sources. Thereby, different treatment areas can be cooled to different degrees.

The document US 2002/0023589 A1 describes a plasma reactor with a discharge tube comprising coaxially spaced cooling areas respectively connected to a supply line and a return line for a cooling fluid. Thus, different areas of the discharge tube can be cooled with different intensities.

SUMMARY OF THE INVENTION

It is the object of the present invention to provide a plasma reactor with an improved cooling device, wherein a uniform cooling of the work occurs without the danger of local overheating or undercooling.

Accordingly, the cooling device consists of at least two cooling elements that are not continuously controlled but adapted to be switched on and off. The cooling elements are cooling coils, the windings of which are interlaced with each other and which are adapted to be switched on and off individually.

Due to the fact that the cooling elements are individually switched on and off in binary operation, a simple dosing of the cooling power is possible. The invention is based on the thought that the heat energy transferred from the work to the cooling elements by heat radiation depends on the fourth power of the temperature of the cooling elements. Consequently, switching on and off has a much stronger effect upon the change of the cooling load than a continuous control. The cooling elements are connected such that a stepwise change of the cooling power is effected.

The cooling elements are arranged in alternating succession. Thus, they form an interlaced structure in which neighboring cooling elements have different temperatures, the cooling power, however, is uniformly distributed over a larger area. This is an effect comparable to the effect of black and white pixels in a gray picture. Being viewed from a greater distance, the individual pixels blur to gray tints. The invention does without a control of the coolant temperature and provides a switching on and off of cooling elements arranged in an interlaced manner.

The cooling device may surround the process room at the outside thereof or even be arranged in the interior of the process room. Suitably, it only extends over the central portion of the height of the process room and spares the ends because at the ends, an increased heat radiation occurs anyway by the housing.

Preferably, the cooling elements are configured as cooling coils that are helically wound, the windings of several cooling elements alternating with each other. The windings should be spaced from each other in order to not obstruct the gas flow. A gas flow occurs in the cooling phase after completion of the plasma treatment.

BRIEF DESCRIPTION OF THE DRAWING

Hereinafter, an embodiment of the invention is explained in detail with reference to the only FIGURE of the drawing.

In the drawing, a longitudinal cross-section of a plasma reactor is schematically shown.

DETAILED DESCRIPTION OF THE PREFERRED EMBODIMENT

Here, the plasma reactor is configured as a hood type furnace. It comprises a container 10 with a bottom 11 and a detachable hood 12. The container 10 is vacuum-tight. It includes the process room 13 in which a batch of works 14 to be treated is arranged. In the present embodiment, the process room 13 is annular. The works 14 rest on isolators 20 on the bottom 11. In the hood 12, there is a radial blower 17 with a motor 17*a*.

The work 14 is connected to a pole of the voltage source 18. The other pole of the voltage source is connected to the ground of the container 10. The container 10 is adapted to be connected to a (non-illustrated) vacuum source to generate a vacuum in the container. Further, the container can be connected to one or more gas sources to introduce a working gas or an inert gas into the container.

Two cooling devices 15,16 are located in the container 10. The cooling device 15 surrounds the process room 13 and the second cooling device 16 is enclosed by the process room.

The cooling device consists of a first cooling element 15*a* in the form of a helical coiled tubing and a second cooling element 15*b* in the form of a helical coiled tubing. The windings of the two helical cooling elements 15*a*, 15*b* lie on the same imaginary cylinder jacket so that the cooling device 15 altogether consists of a single-layer double-threaded screw. The windings of the first and the second cooling element 15*a*, 15*b* are arranged at mutual distances in such a manner that the windings of both cooling elements alternate with each other. Therefore, the windings are interlaced with each other. With three cooling elements, the windings would occur in the sequence a, b, c, a, b . . . . In the drawing, the windings of the first cooling element 15*a* are drawn with a greater line thickness than those of the second cooling element for a better differentiability.

The cooling element 15a has an inlet Z1 and an outlet A1. The cooling element 15b has an inlet Z2 and an outlet A2. Both cooling elements are flown through by water independently of each other. The water is cold compared with the temperature the work 14 assumes during the plasma treatment (about 200 to 800° C.). Therefore, the work 14 transfers radiation heat to the cooling elements of the cooling device 15. The cooling elements are adapted to be switched on and off individually. In the state of being switched on, the cooling element is flown through by coolant. In the state of being switched off, the coolant comes to a stop and is heated or removed. In case of a great need of cooling, both cooling elements 15a, 15b are switched on and in case of a smaller need of cooling, only one of the cooling elements is switched on. In any case, the cooling surface facing the work 14 is enlarged by the switched-on cooling element. The invention bases on the enlargement and reduction of this cooling surface.

The inner cooling device 16 comprises a first cooling element 16a in the form of a helical coiled tubing and a second cooling element 16b in the form of a helical coiled tubing. Both coiled tubings are also interlaced with each other, i.e., their windings alternate with each other and they lie on a common cylinder surface. Between the windings, there are distances larger than the outer diameter of the tube. For the purpose of clarification, the tubes of the first cooling element 16a are also drawn with a greater line thickness than those of the second cooling element 16b.

The inlet of the first cooling element 16a is indicated as Z3 and the outlet is indicated as A3. With the second cooling element 16b, the inlet is indicated as Z4 and the outlet as A4. The cooling element 15a is connected with the ground electrode of the voltage source 18 so that this cooling element is co-used as electrode for the plasma production. Similarly, any other cooling element may be connected with the ground electrode.

The upper and the lower end of the process room 13 are free of cooling elements since a larger radiation receiving surface of the container wall for receiving the heat radiation is available for these ends.

First, the plasma reactor is operated in a plasma operational mode in which the container 10 is evacuated and the work is processed while plasma is being produced. In doing so, cooling is effected such that the required number of cooling elements 15a, 15b, 16a, 16b is switched on, the switched-on cooling elements being flown through by coolant. Thereby, the heat-receiving cooling surface is dimensioned correspondingly to the number of the switched-on cooling elements.

Following the plasma operational mode, a cooling operational mode is effected wherein an inert gas, nitrogen, for example, is let into the container 10. In doing so, the radial blower 17 is switched on so that the gas is able to circulate in the container. In doing so, the gas passes between the windings of the cooling elements and flows along the work surface. The drawn-in arrows 19 clearly show the gas flow. First, the inert gas flows outward from the radial blower 17 and along the container wall. Then, it radially flows through the cooling device 15, the work 14 and the cooling device 16 to be then taken in again by the blower 17 in the center of the container.

Connecting or disconnecting the individual cooling elements 15a, 15b; 16a, 16b can be effected by heat sensors for detecting the temperature at certain sites of the interior of the reactor 10.

Although the invention has been described and illustrated with reference to a specific illustrative embodiment thereof, it is not intended that the invention be limited to this illustrative embodiment. Those skilled in the art will recognize that variations and modifications can be made without departing from the true scope of the invention as defined by the claims that follow. It is therefore intended to include within the invention all such variations and modifications as fall within the scope of the appended claims and equivalents thereof.

What is claimed is:

1. A plasma heat treatment reactor comprising a vacuum-tight container (10) adapted to be connected with a vacuum pump and including a process room (13) of an annular shape for receiving work (14), a voltage source (18) for applying a voltage to the work (14), a switchable radiation receiver (15, 16;) in said process room (13) for controlling the temperature radiating from the work (14), said switchable radiation receiver (15, 16;) including at least one cooling device (15, 16) arranged in the container (10) and including at least four cooling elements (15a, 15b; 16a, 16b) for dissipating heat radiating from the work (14), the at least four cooling elements (15a, 15b; 16a, 16b) being cooling coils having windings which are interlaced with each other in respective pairs (15a, 15b and 16a, 16b), a first interlaced pair (16a, 16b) of the at least four cooling elements (15a, 15b; 16a, 16b) being surrounded by the annular process room (13); a remaining interlaced pair (15a, 15b) of the at least four cooling elements (15a, 15b; 16a, 16b) being annularly arranged exteriorly to and about the process room (13), and heat sensor means for detecting the temperature of the interior of the reactor (10) whereby connecting or disconnecting the individual cooling elements (15a, 15b; 16a, 16b) can be effected.

2. The plasma heat treatment reactor as defined in claim 1 wherein the interlaced cooling coil windings of each pair (15a, 15b and 16a, 16b) are arranged in alternating succession.

3. The plasma heat treatment reactor as defined in claim 1 characterized in that the process room (13) has a predetermined height, and the at least four cooling elements (15a, 15b; 16a, 16b) extend over at least three-quarters of the predetermined height of the process room (13) and effect horizontal gas flow therethrough.

4. The plasma heat treatment reactor as defined in claim 1 characterized in that at least one (15a) of the at least four cooling elements (15a, 15b; 16a, 16b) is connected to the voltage source (18) as an electrode.

5. The plasma heat treatment reactor as defined in claim 1 characterized in that the process room (13) has a predetermined height, and the remaining two cooling elements (15a, 15b) extend over a central portion of the height of the process room (13) and leave the ends uninfluenced.

6. The plasma heat treatment reactor as defined in claim 2 characterized in that the process room (13) has a predetermined height, and the at least four cooling elements (15a, 15b; 16a, 16b) extend over at least three-quarters of the height of the process room (13).

* * * * *